United States Patent
Wang (10) Patent No.: US 11,362,102 B1
(45) Date of Patent: Jun. 14, 2022

(54) SEMICONDUCTOR DEVICE AND FABRICATION METHOD THEREOF

(71) Applicant: UNITED MICROELECTRONICS CORP., Hsin-Chu (TW)

(72) Inventor: Chia-Wen Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/185,995

(22) Filed: Feb. 26, 2021

(51) Int. Cl.
*H01L 27/11568* (2017.01)
*H01L 29/66* (2006.01)
*H01L 29/792* (2006.01)

(52) U.S. Cl.
CPC .. *H01L 27/11568* (2013.01); *H01L 29/66833* (2013.01); *H01L 29/792* (2013.01)

(58) Field of Classification Search
CPC ......... H01L 27/11568; H01L 29/66833; H01L 29/792
See application file for complete search history.

(56) References Cited

U.S. PATENT DOCUMENTS

2013/0334651 A1\* 12/2013 Doris ................ H01L 29/78609
257/E21.546

\* cited by examiner

*Primary Examiner* — Mohammad M Choudhry
(74) *Attorney, Agent, or Firm* — Winston Hsu (57) ABSTRACT

A semiconductor device includes a substrate having thereon at least one active area and at least one trench isolation region adjacent to the at least one active area. A charge trapping structure is disposed on the at least one active area and at least one trench isolation region. At least one divot is disposed in the at least one trench isolation region adjacent to the charge trapping structure. A silicon oxide layer is disposed in the at least one divot. A gate oxide layer is disposed on the at least one active area around the charge trapping structure.

10 Claims, 8 Drawing Sheets

SEMICONDUCTOR DEVICE AND FABRICATION METHOD THEREOF

BACKGROUND OF THE INVENTION

1. Field of the Invention

The present invention relates to the field of semiconductor technology. More particularly, the present invention relates to a nonvolatile memory (NVM) device with oxide-nitride-oxide (ONO) structure.

2. Description of the Prior Art

NVM device which is able to continually store information even when the supply of electricity is removed from the device has been widely adopted by bulk solid state memory applications.

To take an electrically-erasable programmable read-only memory (EEPROM) device having an oxide-nitride-oxide (ONO) structure for example, the EEPROM device includes a plurality of memory cells, each of which includes an ONO structure formed on a substrate, a control gate electrode formed on the ONO structure, a select gate electrode formed on a gate oxide and a source/drain structure formed in the substrate.

Typically, the profile of the ONO structure involved in each memory cell is defined by an etching process using the substrate as a stop layer after defining the tunnel region. However, a portion of the trench isolation region around the ONO structure not covered by a photoresist layer used to define the profile of the ONO structure may be over etched during the etching process. Therefore, it inevitably increases the risk of high-k residue encroaching at the trench isolation region adjacent to the ONO structure.

Therefore, there is a need of providing an improved memory device and a method for fabricating the same to obviate the drawbacks encountered from the prior art.

SUMMARY OF THE INVENTION

It is one object of the present invention to provide an improved semiconductor memory device and a method for fabricating the same in order to overcome the above-mentioned prior art shortcomings or deficiencies.

According to one aspect of the invention, a method for forming a semiconductor device is disclosed. A substrate having thereon at least one active area and at least one trench isolation region adjacent to the at least one active area is provided. A pad oxide layer is disposed on the at least one active area. The pad oxide layer and the at least one trench isolation region in a first region of the substrate are etched. A charge trapping structure is formed on the substrate and at least one divot is formed in the at least one trench isolation region adjacent to the charge trapping structure. The charge trapping structure comprises a bottom oxide layer, a top oxide layer, and a nitride layer between the bottom oxide layer and the top oxide layer.

Subsequently, a pre-clean process is performed to remove the top oxide layer from the charge trapping structure, thereby exposing the nitride layer. A buffer oxide layer is formed on the at least one active area and on the nitride layer. A silicon layer is formed on the substrate. The silicon layer is etched to expose the buffer oxide layer. A portion of the silicon layer remains in the at least one divot. An oxidation process is performed to form a gate oxide layer on the at least one active area around the charge trapping structure and a silicon oxide layer in the at least one divot.

According to some embodiments, after performing the oxidation process, a first polysilicon gate and a second polysilicon gate are formed on the at least one active area in the first region and in the second region, respectively. The first polysilicon gate is disposed on the charge trapping structure and the second polysilicon gate is disposed on the gate oxide layer.

According to some embodiments, the buffer oxide layer has a first thicknesses on the at least one active area and a second thickness on the nitride layer. The first thickness is greater than the second thickness.

According to some embodiments, the first thickness is about 15-20 angstroms and the second thickness is equal to or less than 10 angstroms.

According to some embodiments, the silicon layer is an amorphous silicon layer.

According to some embodiments, the silicon layer is a polysilicon layer.

According to some embodiments, the nitride layer comprises a silicon nitride layer.

According to some embodiments, a top surface of the silicon oxide layer in the at least one divot is higher than a top surface of the at least one trench isolation region.

According to some embodiments, a top surface of the silicon oxide layer in the at least one divot is lower than a top surface of the at least one trench isolation region.

According to some embodiments, the charge trapping structure does not overlap with the pad oxide layer.

According to another aspect of the invention, a semiconductor device includes a substrate having thereon at least one active area and at least one trench isolation region adjacent to the at least one active area. A charge trapping structure is disposed on the at least one active area and at least one trench isolation region. At least one divot is disposed in the at least one trench isolation region adjacent to the charge trapping structure. A silicon oxide layer is disposed in the at least one divot. A gate oxide layer is disposed on the at least one active area around the charge trapping structure.

According to some embodiments, the semiconductor device further includes a first gate on the charge trapping structure, and a second gate on the gate oxide layer.

According to some embodiments, the charge trapping structure comprises a bottom oxide layer, a buffer oxide layer, and a nitride layer between the bottom oxide layer and the buffer oxide layer.

According to some embodiments, the nitride layer comprises a silicon nitride layer.

According to some embodiments, a top surface of the silicon oxide layer in the at least one divot is higher than a top surface of the at least one trench isolation region.

According to some embodiments, a top surface of the silicon oxide layer in the at least one divot is lower than a top surface of the at least one trench isolation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4A to FIG. 9A and FIG. 4B to FIG. 9B illustrate a method of forming the semiconductor memory device as set forth in FIG. 1 to FIG. 3.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
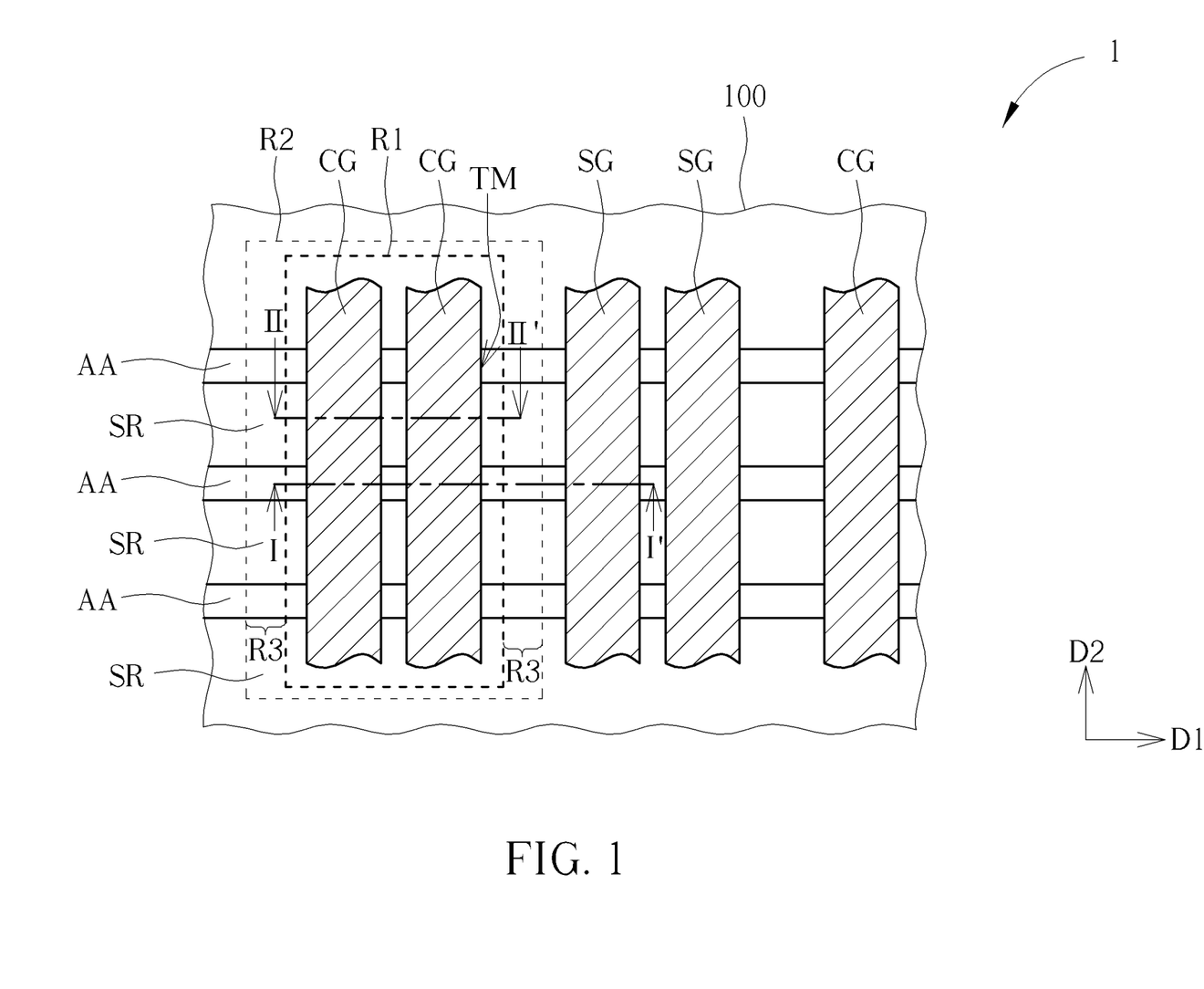
FIG. 1 is a schematic partial layout of a semiconductor memory device.
Figure 2:
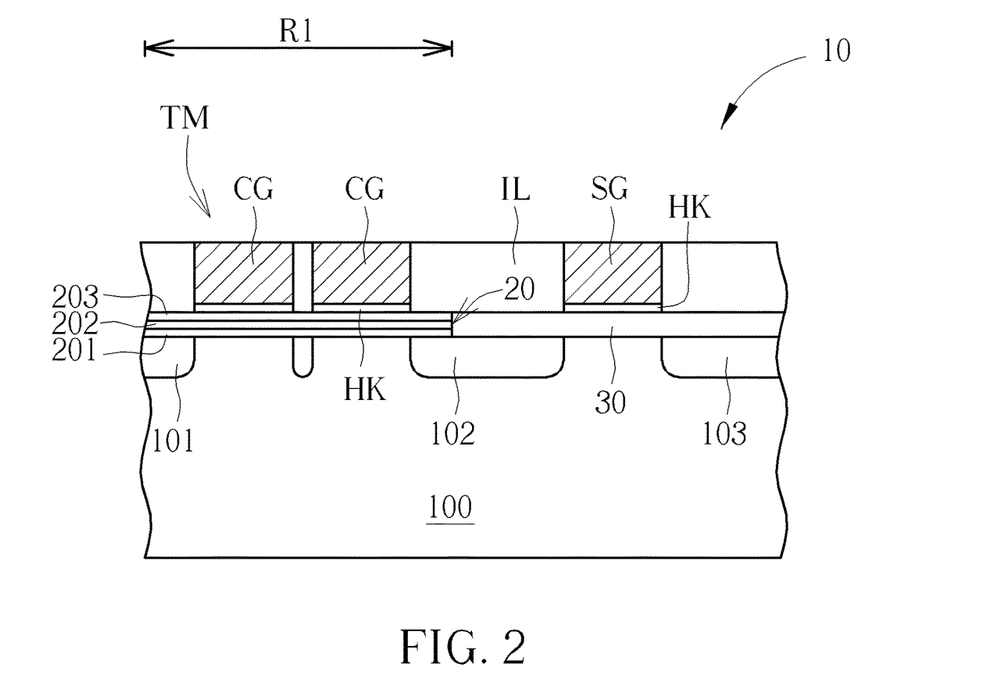
FIG. 2 is a cross-sectional view taken along line I-I' in FIG. 1.
Figure 3:
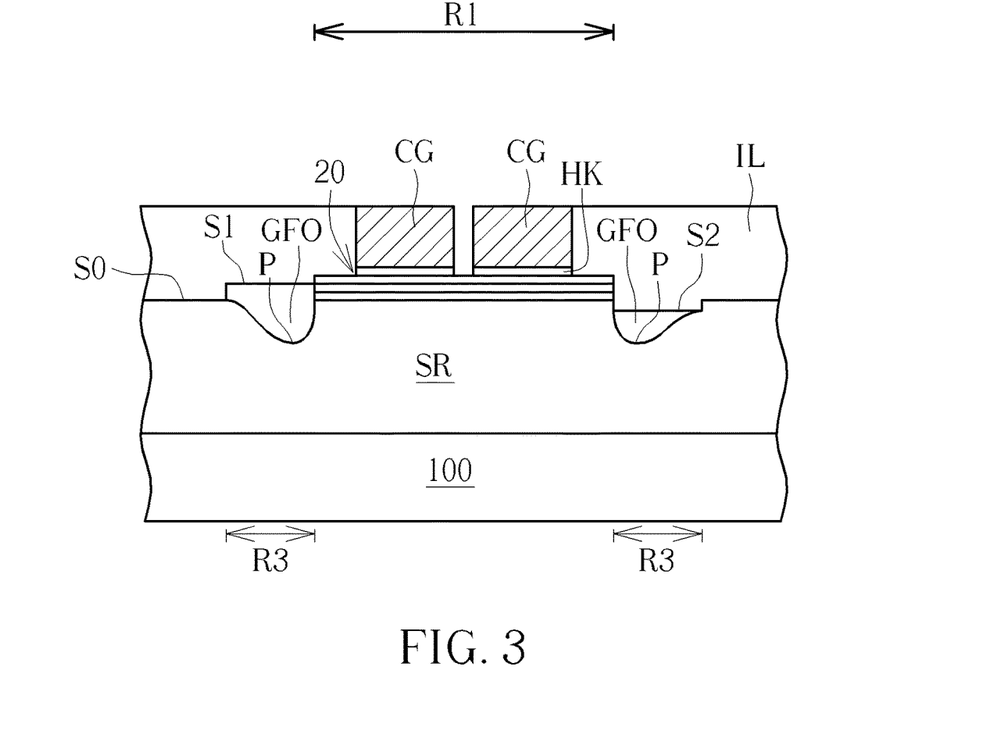
FIG. 3 is a cross-sectional view taken along line II-IF in FIG. 1.

Please refer to FIG. 1 to FIG. 3. FIG. 1 is a schematic partial layout of a semiconductor memory device. FIG. 2 is a cross-sectional view taken along line I-I' in FIG. 1. FIG. 3 is a cross-sectional view taken along line II-IF in FIG. 1. As shown in FIG. 1 to FIG. 3, a semiconductor memory device 1 comprises a substrate 100 having thereon at least one active area AA and at least one trench isolation region SR adjacent to the at least one active area AA is provided. According to an embodiment, for example, the substrate 100 may be a silicon substrate, such as a P-type silicon substrate, but is not limited thereto. For illustration purposes, three exemplary active areas AA extending along a first direction D1 are presented and each of the active areas AA is isolated by an adjacent trench isolation region SR.

As shown in FIG. 1, the semiconductor memory device 1 further comprises at least one control gate CG and at least one select gate SG extending along a second direction D2. For illustration purposes, three exemplary control gates CG and two select gates SG extending along the second direction D2 are presented in FIG. 1.

As shown in FIG. 1 to FIG. 3, a charge trapping structure 20 is disposed on the at least one active area AA and at least one trench isolation region SR. The control gate CG is disposed on the charge trapping structure 20 so as to form a storage transistor TM. A gate oxide layer 30 is disposed on the at least one active area AA around the charge trapping structure 20. A select gate SG is disposed on the gate oxide layer 30. According to an embodiment, the charge trapping structure 20 may be contiguous with the gate oxide layer 30. The region R1 covered by the charge trapping structure 20 is indicated with a dashed line in FIG. 1.

According to an embodiment, for example, the charge trapping structure 20 may comprise a bottom oxide layer 201, a buffer oxide layer 203, and a nitride layer 202 between the bottom oxide layer 201 and the buffer oxide layer 203. According to an embodiment, the nitride layer 202 may comprise a silicon nitride layer. According to an embodiment, for example, the control gate CG and the select gate SG may be metal gates and may comprise a high dielectric constant (high-k) layer HK. The metal gates and the high-k layer HK may be formed within an inter-layer dielectric (ILD) layer IL and can be formed by using a high-k metal gate process known in the art. Diffusion regions 101-103 such as $N^+$ regions may be provided in the at least one active area AA between the control gate CG and the select gate SG.

In FIG. 1, a tunnel region R2 defined by a tunnel mask is also shown with another dashed line outside the region R1. A pad oxide layer (not shown) on the active areas AA within the tunnel region R2 is removed. When removing the pad oxide layer (not shown) from the active areas AA within the tunnel region R2, an upper portion of the adjacent trench isolation region SR is also etched away. Therefore, the remaining pad oxide layer does not overlap with the charge trapping structure 20 within the region R1, and a non-overlapping region R3 is defined between the region R1 and the tunnel region R2.

As can be best seen in FIG. 3, at least one divot P is disposed in the at least one trench isolation region SR adjacent to the charge trapping structure 20. FIG. 3 shows two divots P on two opposite sides of the charge trapping structure 20, respectively. The at least one divot P is approximately located within the non-overlapping region R3. The at least one divot P is formed when patterning the charge trapping structure 20. The at least one divot P increases the risk of high-k residue encroaching at the trench isolation region SR adjacent to the charge trapping structure 20. The present invention addresses this issue. The divot P in the trench isolation region SR can be eliminated according to the embodiments of the invention.

According to an embodiment, a silicon oxide layer GFO is disposed in the at least one divot P. According to an embodiment, as can be seen on the left side of the charge trapping structure 20 in FIG. 3, a top surface S1 of the silicon oxide layer GFO in the at least one divot P may be higher than a top surface S0 of the at least one trench isolation region SR. According to an embodiment, as can be seen on the right side of the charge trapping structure 20 in FIG. 3, a top surface S2 of the silicon oxide layer GFO in the at least one divot P may be lower than a top surface S0 of the at least one trench isolation region SR.

Figure 4A:
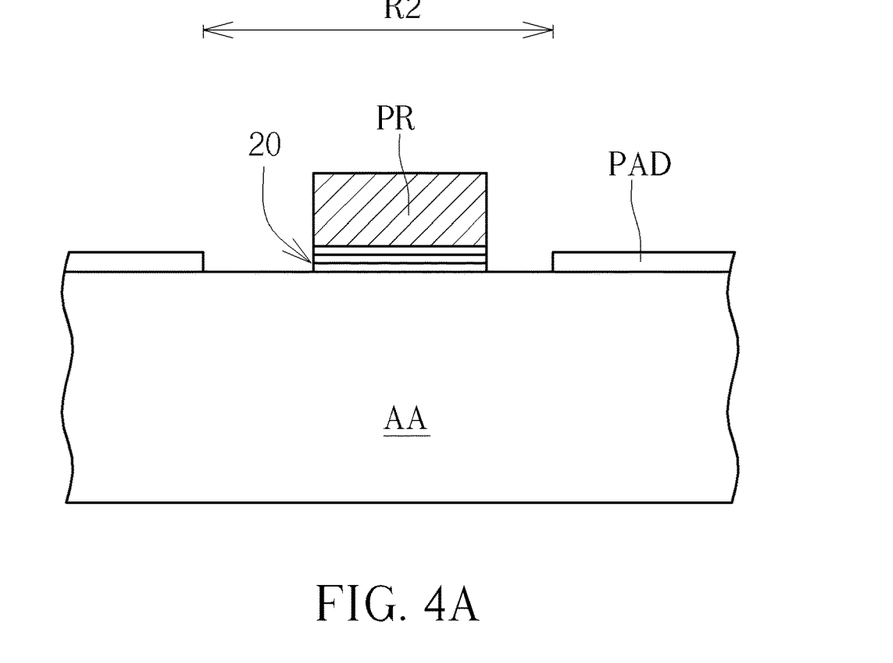
Figure 4B:
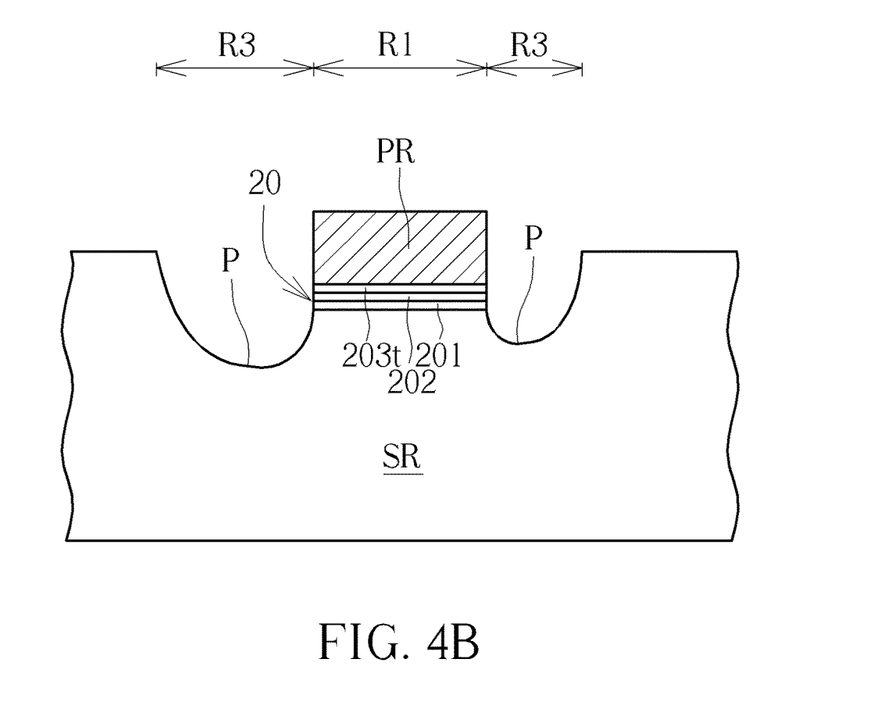

Please refer to FIG. 4A to FIG. 9A and FIG. 4B to FIG. 9B, and briefly to FIG. 1. FIG. 4A to FIG. 9A and FIG. 4B to FIG. 9B illustrate a method of forming the semiconductor memory device 1 as set forth in FIG. 1 to FIG. 3. FIG. 4A to FIG. 9A are sectional views taken along lines I-I' in FIG. 1 during the manufacture of the semiconductor memory device 1. FIG. 4B to FIG. 9B are sectional views taken along lines II-IF in FIG. 1 during the manufacture of the semiconductor memory device 1. As shown in FIG. 4A and FIG. 4B, a substrate 100 having thereon at least one active area AA and at least one trench isolation region SR adjacent to the at least one active area AA is provided. According to an embodiment, for example, the substrate 100 may be a silicon substrate, such as a P-type silicon substrate, but is not limited thereto.

A pad oxide layer PAD is disposed on the at least one active area AA. The pad oxide layer PAD and the at least one trench isolation region SR in the tunnel region R2 of the substrate 100 are etched. A charge trapping structure 20 is formed on the substrate 100 and patterned by using a photoresist layer PR involved in a lithographic process.

When patterning the charge trapping structure 20, at least one divot P is formed in the at least one trench isolation region SR adjacent to the charge trapping structure 20.

The charge trapping structure 20 may comprise a bottom oxide layer 201, a top oxide layer 203t, and a nitride layer 202 between the bottom oxide layer 201 and the buffer oxide layer 203. According to an embodiment, the bottom oxide layer 201 and the top oxide layer 203t may comprise a silicon oxide layer, and the nitride layer 202 may comprise a silicon nitride layer. According to an embodiment, the charge trapping structure 20 does not overlap with the pad oxide layer PAD.

Figure 5A:
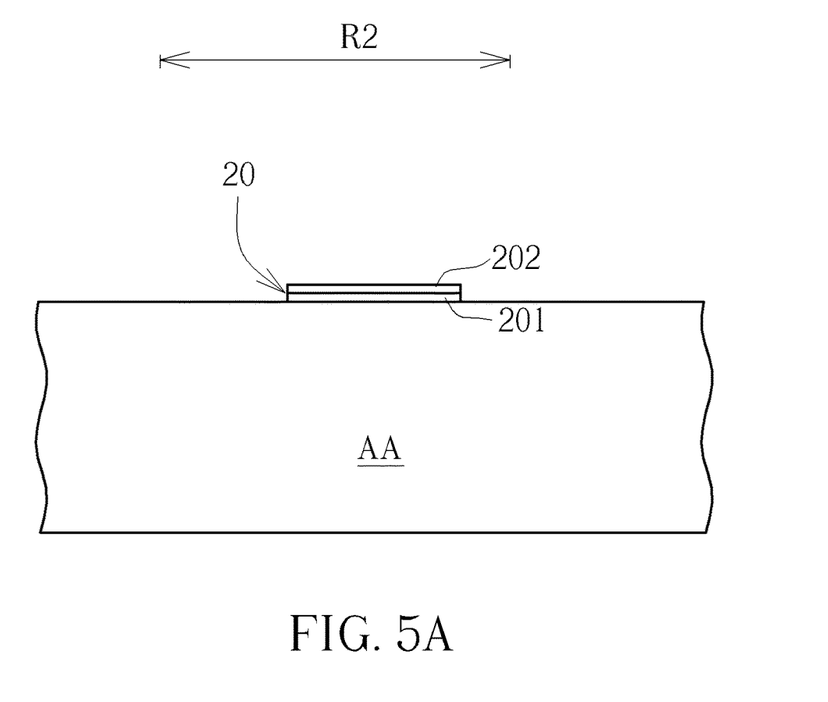
Figure 5B:
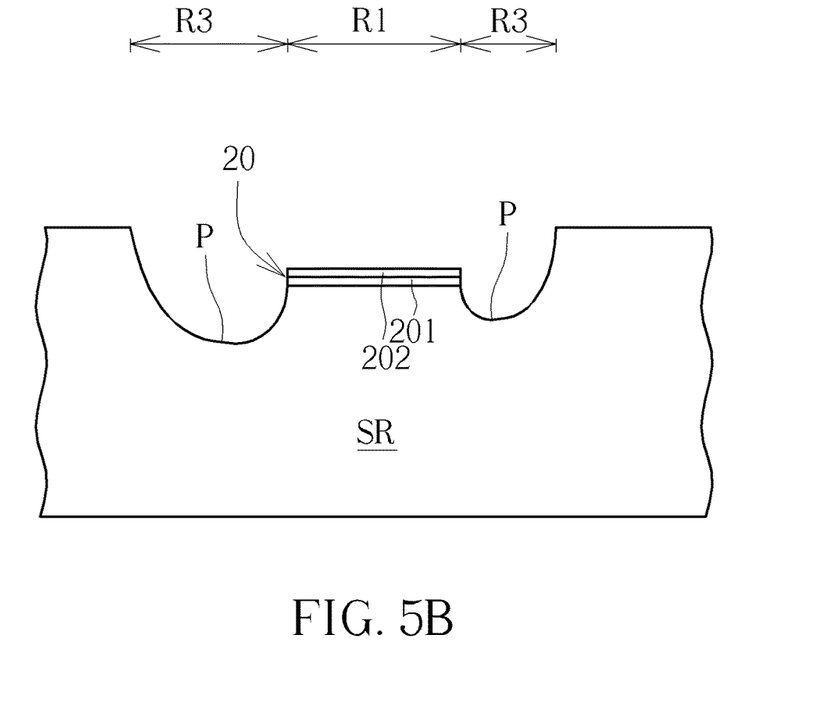

As shown in FIG. 5A and FIG. 5B, the photoresist layer PR is stripped off and a pre-clean process is performed to remove the pad oxide layer PAD from the at least one active area AA of the substrate 100. During the pre-clean process, the top oxide layer 203t may be removed from the charge trapping structure 20, thereby exposing the nitride layer 202. An upper portion of the at least one trench isolation region SR may be consumed during the pre-clean process.

Figure 6A:
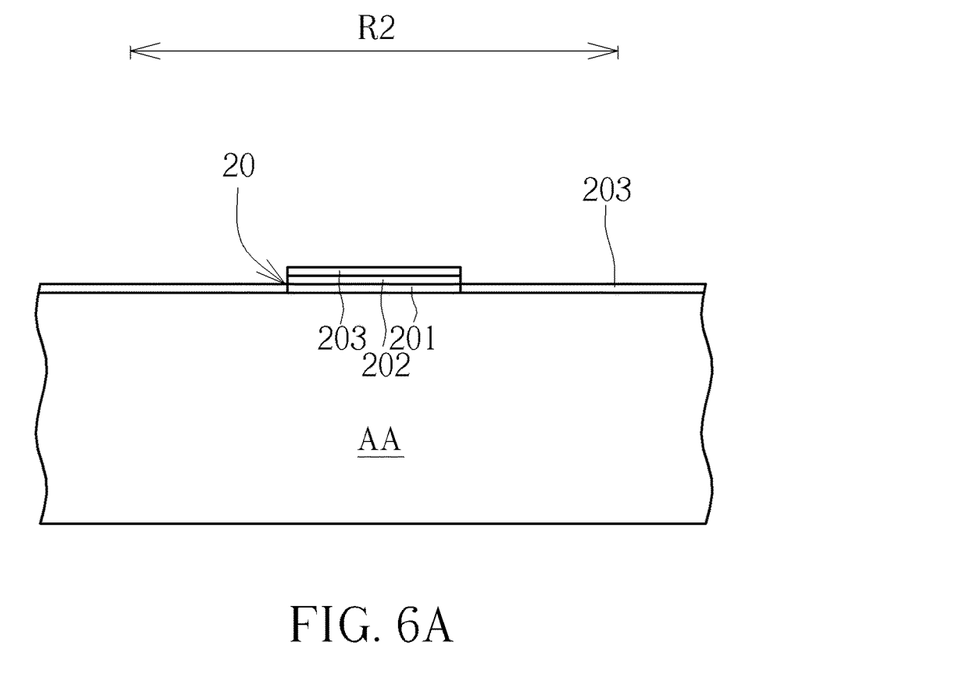
Figure 6B:
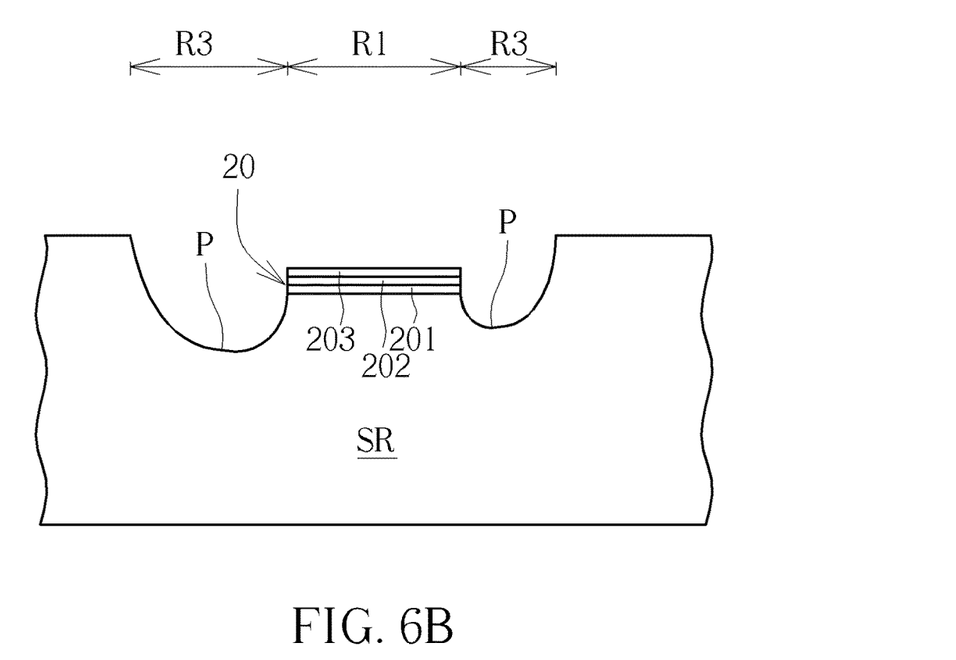

Subsequently, as shown in FIG. 6A and FIG. 6B, a chemical vapor deposition (CVD) process is performed to form a buffer oxide layer 203 on the at least one active area AA and on the nitride layer 202. According to an embodiment, the buffer oxide layer 230 has a first thicknesses on the at least one active area AA and a second thickness on the nitride layer 202. The first thickness is greater than the second thickness. According to an embodiment, for example, the first thickness may be about 15-20 angstroms and the second thickness may be equal to or less than 10 angstroms.

Figure 7A:
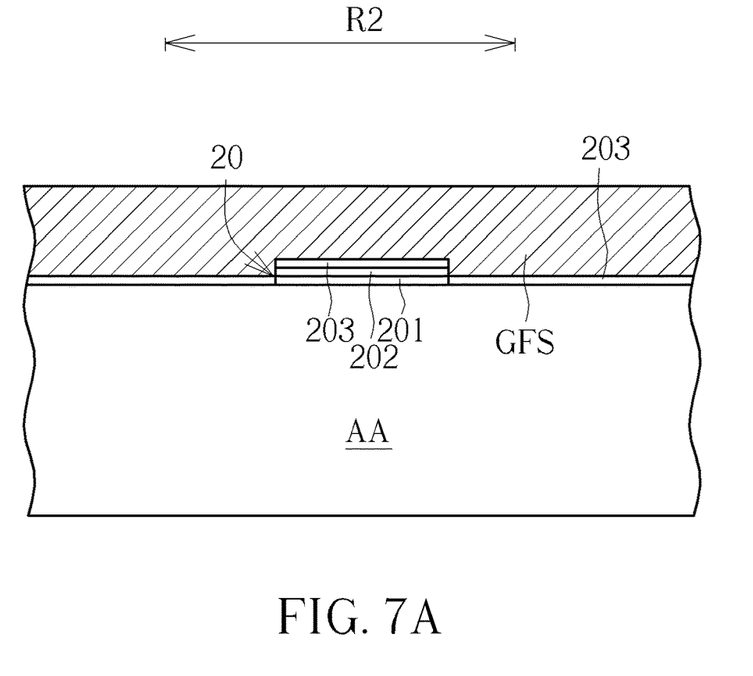
Figure 7B:
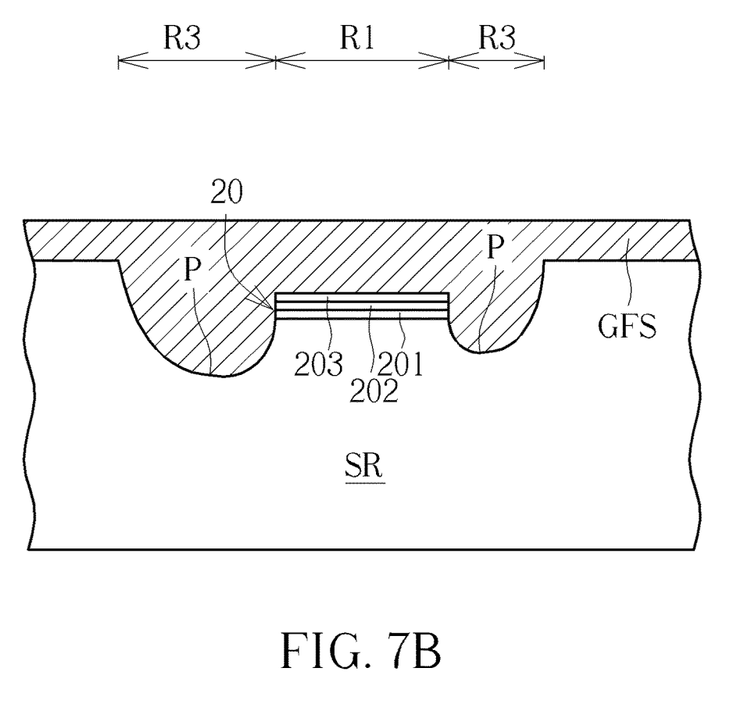

As shown in FIG. 7A and FIG. 7B, a silicon layer GFS is formed on the substrate 100. According to an embodiment, for example, the silicon layer GFS may be deposited on the substrate 100 by using a chemical vapor deposition (CVD) process. For example, the silicon layer GFS may have a thickness of about 200-500 angstroms, but is not limited thereto. According to an embodiment, the silicon layer GFS may be an amorphous silicon layer, but is not limited thereto. In some embodiments, the silicon layer GFS may be a polysilicon layer. According to an embodiment, the charge trapping structure 20 is covered by the silicon layer GFS and the at least one divot P is completely filled with the silicon layer GFS.

Figure 8A:
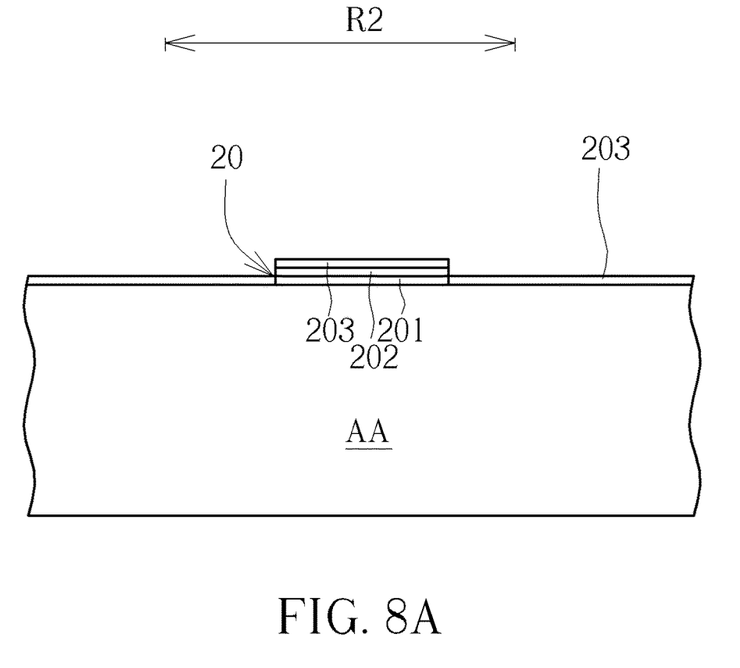
Figure 8B:
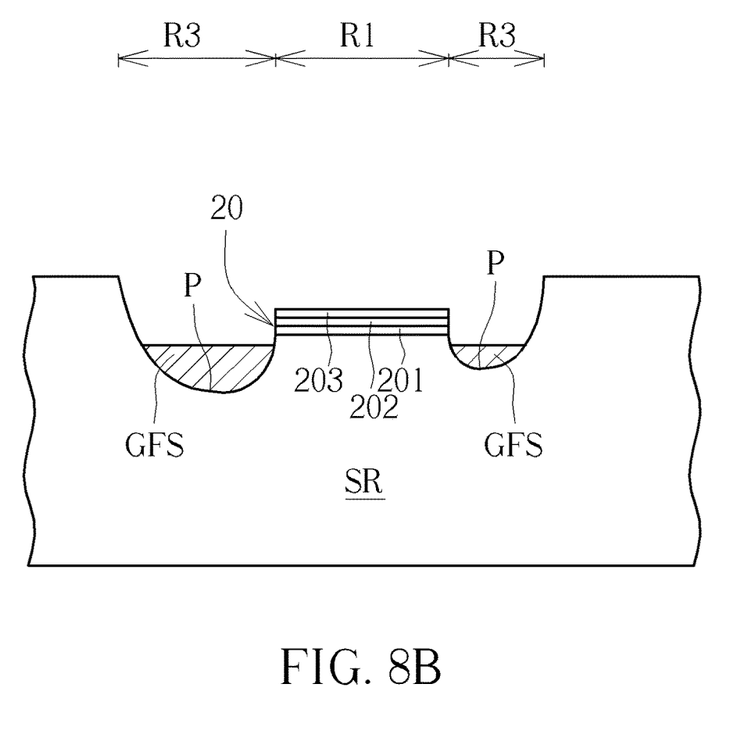

As shown in FIG. 8A and FIG. 8B, an etching process such as a dry etching process is then performed. The silicon layer GFS is etched to expose the buffer oxide layer 203. A portion of the silicon layer GFS remains in the at least one divot P.

Figure 9A:
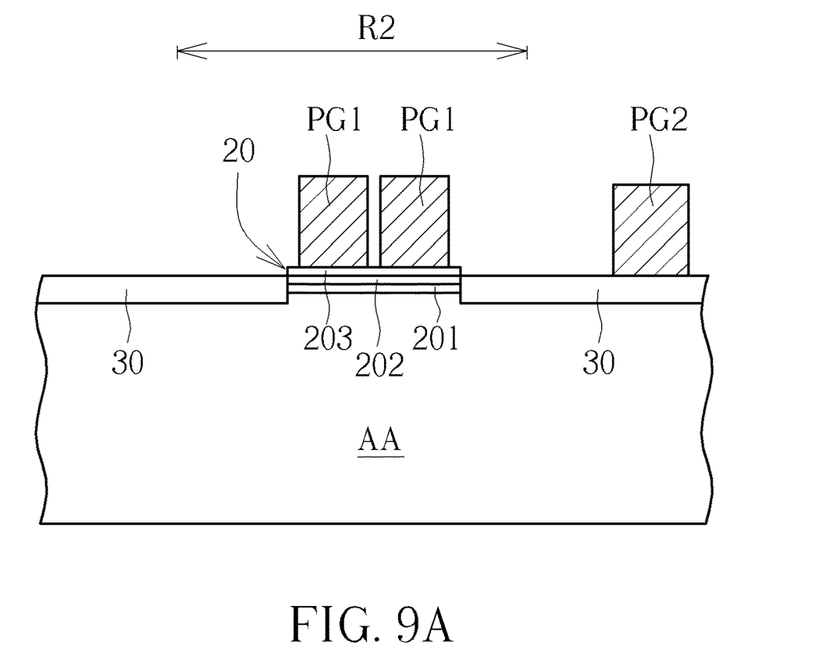
Figure 9B:
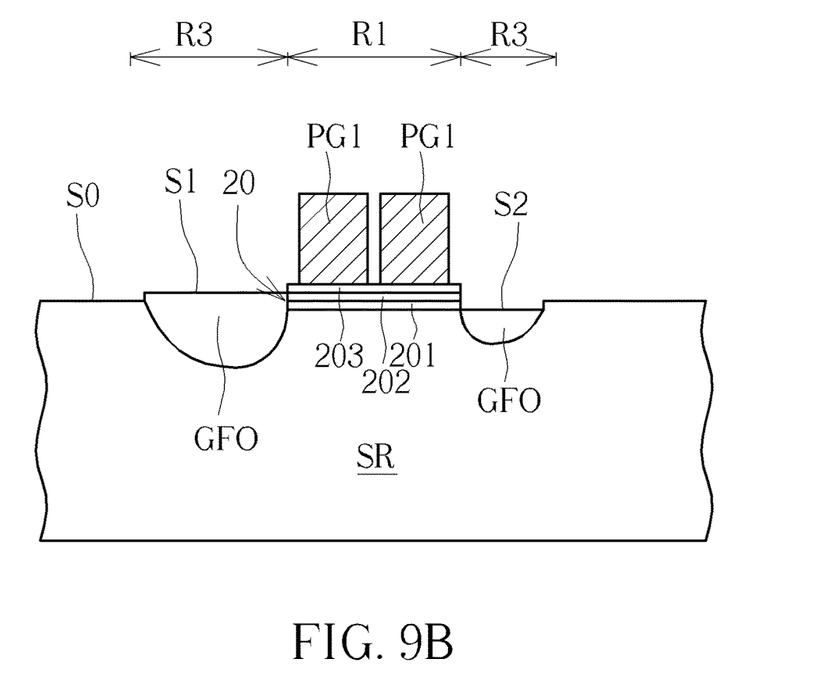

As shown in FIG. 9A and FIG. 9B, an oxidation process such as a furnace wet oxidation process is then performed to form a gate oxide (5V oxide) layer 30 on the at least one active area AA around the charge trapping structure 20 and a silicon oxide layer GFO in the at least one divot P. According to some embodiments, as can be seen on the left side of the charge trapping structure 20 in FIG. 9B, a top surface S1 of the silicon oxide layer GFO in the at least one divot P may be higher than a top surface S0 of the at least one trench isolation region SR. According to some embodiments, as can be seen on the right side of the charge trapping structure 20 in FIG. 9B, a top surface S2 of the silicon oxide layer GFO in the at least one divot P may be lower than a top surface S0 of the at least one trench isolation region SR.

According to an embodiment, after performing the oxidation process, polysilicon gates PG1 may be formed on the charge trapping structure 20 and a polysilicon gate PG2 may be formed on the gate oxide layer 30. According to an embodiment, in a subsequently process, the polysilicon gates PG1 and the polysilicon gate PG2 may be replaced with metal gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate having thereon at least one active area and at least one trench isolation region adjacent to the at least one active area, wherein a pad oxide layer is disposed on the at least one active area;
   etching the pad oxide layer and the at least one trench isolation region in a first region of the substrate;
   forming a charge trapping structure on the substrate and at least one divot in the at least one trench isolation region adjacent to the charge trapping structure, wherein the charge trapping structure comprises a bottom oxide layer, a top oxide layer, and a nitride layer between the bottom oxide layer and the top oxide layer;
   performing a pre-clean process to remove the top oxide layer from the charge trapping structure, thereby exposing the nitride layer;
   forming a buffer oxide layer on the at least one active area and on the nitride layer;
   forming a silicon layer on the substrate;
   etching the silicon layer to expose the buffer oxide layer, wherein a portion of the silicon layer remains in the at least one divot; and
   performing an oxidation process to form a gate oxide layer on the at least one active area around the charge trapping structure and a silicon oxide layer in the at least one divot.

2. The method according to claim 1, wherein after performing the oxidation process, the method further comprises:
   forming a first polysilicon gate and a second polysilicon gate on the at least one active area in the first region and in the second region, respectively, wherein the first polysilicon gate is disposed on the charge trapping structure and the second polysilicon gate is disposed on the gate oxide layer.

3. The method according to claim 1, wherein the buffer oxide layer has a first thicknesses on the at least one active area and a second thickness on the nitride layer, wherein the first thickness is greater than the second thickness.

4. The method according to claim 3, wherein the first thickness is about 15-20 angstroms and the second thickness is equal to or less than 10 angstroms.

5. The method according to claim 1, wherein the silicon layer is an amorphous silicon layer.

6. The method according to claim 1, wherein the silicon layer is a polysilicon layer.

7. The method according to claim 1, wherein the nitride layer comprises a silicon nitride layer.

8. The method according to claim 1, wherein a top surface of the silicon oxide layer in the at least one divot is higher than a top surface of the at least one trench isolation region.

9. The method according to claim 1, wherein a top surface of the silicon oxide layer in the at least one divot is lower than a top surface of the at least one trench isolation region.

10. The method according to claim 1, wherein the charge trapping structure does not overlap with the pad oxide layer.

\* \* \* \* \*